(12) United States Patent
Weinstein et al.

(10) Patent No.: US 8,624,337 B2
(45) Date of Patent: Jan. 7, 2014

(54) RESONANT BODY TRANSISTOR AND OSCILLATOR

(75) Inventors: Dana Weinstein, Ithaca, NY (US); Sunil A. Bhave, Ithaca, NY (US)

(73) Assignee: Cornell University, Ithaca, NY (US)

( * ) Notice: Subject to any disclaimer, the term of this patent is extended or adjusted under 35 U.S.C. 154(b) by 633 days.

(21) Appl. No.: 12/811,552

(22) PCT Filed: Dec. 11, 2008

(86) PCT No.: PCT/US2008/086439
§ 371 (c)(1),
(2), (4) Date: Sep. 17, 2010

(87) PCT Pub. No.: WO2009/076534
PCT Pub. Date: Jun. 18, 2009

(65) Prior Publication Data
US 2011/0024812 A1 Feb. 3, 2011

Related U.S. Application Data

(60) Provisional application No. 61/012,821, filed on Dec. 11, 2007.

(51) Int. Cl.
*H01L 29/00* (2006.01)
(52) U.S. Cl.
USPC ............. 257/415; 438/50; 257/E29.324
(58) Field of Classification Search
None
See application file for complete search history.

(56) References Cited

U.S. PATENT DOCUMENTS

| | | | |
|---|---|---|---|
| 5,075,641 A * | 12/1991 | Weber et al. | 331/108 C |
| 5,198,716 A * | 3/1993 | Godshall et al. | 310/349 |
| 6,574,130 B2 * | 6/2003 | Segal et al. | 365/129 |
| 7,061,055 B2 | 6/2006 | Sekigawa et al. | |
| 7,625,772 B2 * | 12/2009 | Casset et al. | 438/50 |
| 7,868,403 B1 * | 1/2011 | Ivanov et al. | 257/417 |
| 2001/0033119 A1 * | 10/2001 | Nguyen | 310/309 |
| 2002/0072163 A1 * | 6/2002 | Wong et al. | 438/200 |
| 2004/0021403 A1 * | 2/2004 | Ayazi et al. | 310/365 |

(Continued)

FOREIGN PATENT DOCUMENTS

JP 2005174960 A 6/2005

OTHER PUBLICATIONS

Hon-Sum Philip Wong, et al, "Nanoscale CMOS", Proceedings of the IEEE, Apr. 1999, vol. 87, No. 4, pp. 537-570.

(Continued)

*Primary Examiner* — Steven J Fulk
(74) *Attorney, Agent, or Firm* — Heslin Rothenberg Farley & Mesiti P.C.

(57) ABSTRACT

A resonator body has an inversion gate, an accumulation gate, and a center region. The resonator body also has a source contact coupled to the center region and a drain contact coupled to the center region. The resonator body further has a first dielectric layer coupled between the inversion gate and the center region. The resonator body also has a second dielectric layer coupled between the accumulation gate and the center region. A resonant body transistor is also disclosed. The resonant body transistor has an inversion gate electrode, an accumulation gate electrode, a source electrode, a drain electrode, and a plurality of anchor beams. The resonant body transistor also has a resonator body coupled-to and suspended-from the inversion gate electrode, the accumulation gate electrode, the source electrode, and the drain electrode by the plurality of anchor beams. A resonant body oscillator is also disclosed.

42 Claims, 11 Drawing Sheets

(56) References Cited

U.S. PATENT DOCUMENTS

| | | | |
|---|---|---|---|
| 2005/0037547 A1* | 2/2005 | Bertin et al. | 438/142 |
| 2005/0136585 A1* | 6/2005 | Chau et al. | 438/214 |
| 2006/0202779 A1* | 9/2006 | Fazzio et al. | 333/187 |
| 2007/0120200 A1 | 5/2007 | Yun | |
| 2008/0150647 A1* | 6/2008 | Yang et al. | 331/154 |
| 2009/0108381 A1* | 4/2009 | Buchwalter et al. | 257/415 |
| 2009/0321793 A1* | 12/2009 | Ollier et al. | 257/254 |

OTHER PUBLICATIONS

International Search Report for PCT/US2008/086439 dated Feb. 27, 2009.

* cited by examiner

US 8,624,337 B2

RESONANT BODY TRANSISTOR AND OSCILLATOR

RELATED APPLICATIONS

This patent application is a national stage filing under Section 371 of International Application No. PCT/US2008/086439 filed on Dec. 11, 2008, and published in English on Jun. 18, 2009 as WO 2009/076534, and which claims priority to U.S. Provisional Patent Application No. 61/012,821 filed on Dec. 11, 2007, the entire disclosures of International Application No. PCT/US2008/086439 and U.S. Provisional Patent Application No. 61/012,821 are incorporated herein by reference in their entirety.

FIELD

The claimed invention relates to the field of oscillators, and more specifically to an oscillator having a resonating body transistor.

BACKGROUND

As we scale to deep sub-micron (DSM) technology, transistor threshold frequencies increase, enabling the design of complementary metal oxide semiconductor (CMOS) circuits for radio frequency (RF) and mm-wave applications up to 67 GHz. However, such high-frequency CMOS transistors have very limited gain, resulting in poor output power. A successful transition into DSM CMOS applications therefore requires high-Q, low-power components operating at high frequencies.

Another challenge facing DSM circuits is the increasing density of devices, projected to reach $10^{11}$ devices/cm$^2$. At such densities, clock distribution and the power consumption associated with it necessitate implementation of low-power local clocks with the potential for global synchronization.

There are currently electromechanical resonators and oscillators in the market taking advantage of the high quality factors of acoustic resonators to try to solve the above problems in CMOS design. The highest performance products available are at SiTime® (www.sitime.com), but have a limited frequency range of 1-125 MHz. The SiTime products are off-chip with dimensions ~1 mm$^2$. They do not incorporate transistor action into the body of the resonator.

In 1967, Nathanson et al. demonstrated the Resonant Gate Transistor (in IEEE Trans. Electron Devices, Vol. 14, pages 117-133) driving resonance in a conductive gold cantilever with an air-gap capacitive electrode. The Resonant Gate Transistor (RGT) cantilever functions as the gate of an airgap transistor, with output drain current modulated by the cantilever resonant motion. Resonant Gate transistors were demonstrated with frequencies up to 100 kHz.

In 2003, Leland Chang introduced the concept of a Resonant Body Transistor (RBT) in his Ph.D. thesis in the Electrical Engineering and Computer Science department at University of California, Berkeley. (L. Chang, Nanoscale Thin-Body CMOS Devices," Chapter 8, PhD. Dissertation in Electrical Engineering and Computer Science, University of California, Berkeley, Spring 2003.) As illustrated in FIG. 1, Chang proposed an air-gap flexural mode RBT 30 composed of two clamped-clamped beams 32 coupled together at the two anchor points 34, 36 (double-ended tuning fork configuration). The geometry resembles an air-gap dual-gate FinFET with two fins 38, 40. One fin 38 is biased into accumulation and the other 40 into strong inversion. The device operates as follows:

(1) The top fin 38 is biased in accumulation ($-V_{Gate}$). No current flows across this fin 38, but a capacitive force ($F_{cap,ac} \sim V_{Gate} V_{in} C_{OX1}/g$) from the excitation $V_{in}$ drives resonant motion.

(2) Mechanical vibrations couple the top fin to the bottom fin through the anchors 34, 36 on either end of the beams 32. The bottom fin 40 resonates out of phase with the top fin 38.

(3) The bottom fin 40 is biased in strong inversion ($+V_{Gate}$). As the bottom fin 40 moves, $C_{OX2}$ varies, modulating the drain current $I_{Drain}$.

Unfortunately, there are several obstacles to scaling Chang's air-gap flexural mode RBT 30 for frequencies greater than 10 GHz, such as difficulties obtaining smaller air gaps and difficulties preventing stiction.

Therefore, it would be desirable to have a reliable Resonant Body Transistor that could be scaled for use at very high frequencies, well above the 10 GHz range, that was also practical to fabricate in order to enable the design of deep sub-micron circuits for RF applications.

SUMMARY

A resonator body is disclosed. The resonator body has an inversion gate, an accumulation gate, and a center region. The resonator body also has a source contact coupled to the center region and a drain contact coupled to the center region. The resonator body further has a first dielectric layer coupled between the inversion gate and the center region. The resonator body also has a second dielectric layer coupled between the accumulation gate and the center region, wherein at least one of a length of the resonator body, a width of the resonator body, a height of the resonator body and a gate length define an acoustically resonant mode and resonant frequency.

A resonant body transistor is also disclosed. The resonant body transistor has an inversion gate electrode, an accumulation gate electrode, a source electrode, a drain electrode, and a plurality of anchor beams. The resonant body transistor also has a resonator body coupled-to and suspended from the inversion gate electrode, the accumulation gate electrode, the source electrode, and the drain electrode by the plurality of anchor beams, wherein at least one of a length of the resonator body, a width of the resonator body, a height of the resonator body and a gate length define an acoustically resonant mode and resonant frequency.

A resonant body oscillator is further disclosed. The resonant body oscillator has a resonant body transistor. The oscillator's resonant body transistor has an inversion gate electrode, an accumulation gate electrode, a source electrode, a drain electrode, and a plurality of anchor beams. The oscillator's resonant body transistor also has a resonator body coupled-to and suspended from the inversion gate electrode, the accumulation gate electrode, the source electrode, and the drain electrode by the plurality of anchor beams. The resonant body oscillator further has at least one capacitor coupled to the accumulation gate electrode on one end of the at least one capacitor and configured to receive a ground connection on a second end of the at least one capacitor. The inversion gate electrode is configured to receive a bias voltage. The source electrode is configured to receive a ground connection. The drain electrode is coupled to the accumulation gate electrode and configured to provide an oscillator output.

A method of fabricating a resonant body transistor is disclosed. A base is etched to define a resonant device layer, the device layer comprising a semiconductor material. A sacrificial mask is formed on the etched base and the device layer. A dielectric layer is deposited on the sacrificial mask. A conductive layer is deposited on the dielectric layer. The formed layers are planarized to expose either the device layer or the sacrificial mask. A patterned sacrificial mask is deposited at least over some portions of the conductive layer. Exposed areas of the conductive layer and the dielectric layer are removed. The sacrificial mask and the patterned sacrificial mask are removed, the device layer being in contact with the patterned dielectric layer and the patterned dielectric layer being in contact with the patterned conductive layer.

Figure 1:
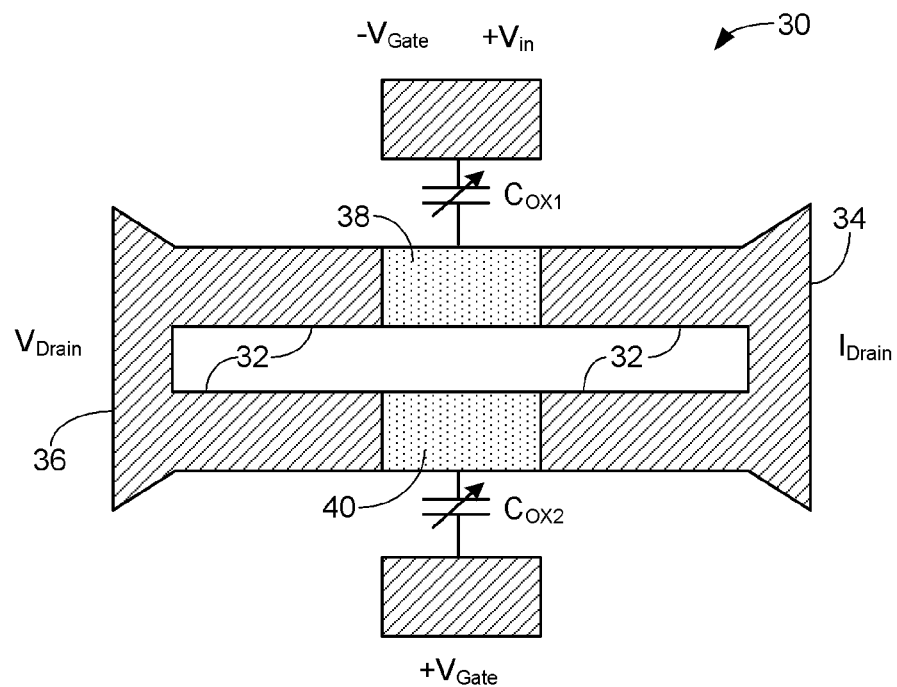
FIG. 1 schematically illustrates an air-gap flexural mode resonant body transistor.

It will be appreciated that for purposes of clarity and where deemed appropriate, reference numerals have been repeated in the figures to indicate corresponding features, and that the various elements in the drawings have not necessarily been drawn to scale in order to better show the features.

Symbol Definitions

| | |
|---|---|
| L | length of resonator |
| W | width of resonator |
| h | height of resonator |
| $L_g$ | gate length |
| d | distance of dielectric from center of bar |
| g | dielectric thickness |
| n | order of harmonic |
| $k_n$ | wavenumber = $n\pi/L$ |
| Y | Young's modulus |
| $\rho$ | mass density |
| $\epsilon_f$ | permittivity of dielectric |
| $\mu_n$ | electron mobility |
| $\pi_{110}$ | tangential piezoresistive coeff. (110) |
| Q | quality factor of resonance |
| $U_0$ | amplitude of vibrations at resonance |
| x | position along the bar (x = 0 at center) |
| $V_{DC}$ | bias voltage |
| $V_D$ | drain voltage |
| $V_G$ | gate voltage |
| $V_{acc}$ | voltage at accumulation gate |
| $V_T$ | threshold voltage |
| $I_D$ | drain current |
| $v_{ac}$ | ac input voltage |
| $i_{out}$ | ac output current |

Assumed Constants for the Embodiments

| | |
|---|---|
| $\epsilon_0$ | $8.85 \times 10^{-12}$ m$^{-3}$kg$^{-1}$s$^4$A$^2$ |
| $\epsilon_f$ | $7 \cdot \epsilon_0$ |
| h | 250 nm |
| W | 800 nm |
| d | displacement node |
| g | 10 nm |
| n | 3 |
| Y | $170 \times 10^9$ Pa |
| $\rho$ | 2330. kg m$^{-3}$ |
| $\mu_n$ | $300 \times 10^{-4}$ V m$^{-2}$ s$^{-1}$ |
| $\pi_{110}$ | $17 \times 10^{-11}$ Pa$^{-1}$ |
| Q | $5. \times 10^{13}/f$ |
| $V_{DC}$ | 3 V |
| $v_{ac}$ | 0.1 V |
| $V_T$ | 0.6 V |
| $V_G$ | 3 V |
| $V_{acc}$ | $V_D - V_G$ |
| $V_D$ | $(V_G - V_T) + 0.1$ V |

DETAILED DESCRIPTION

Figure 2:
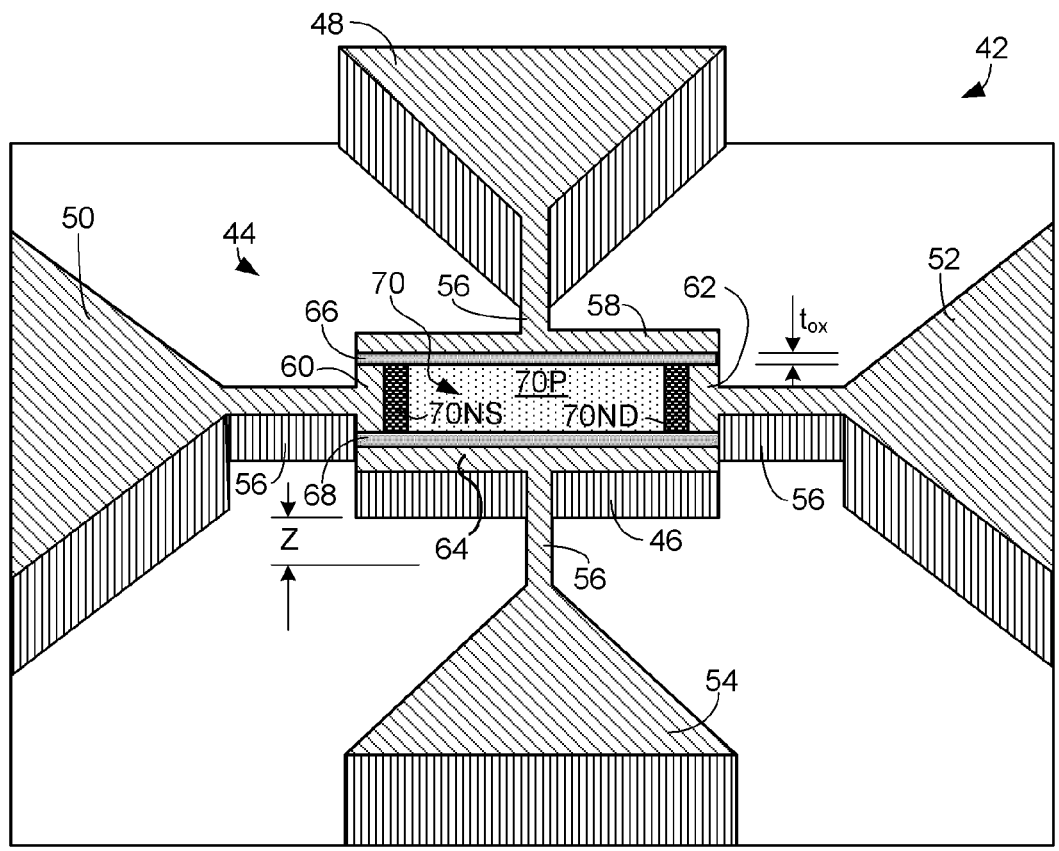
FIG. 2 schematically illustrates one embodiment of an internal dielectric bulk-mode resonant body transistor.

FIG. 2 schematically illustrates one embodiment of an internal dielectric bulk-mode Resonant Body Transistor (RBT) 42. The RBT 42 integrates a sense transistor 44 directly into a resonator body 46. The RBT 42 has an inversion gate electrode 48, a source electrode 50, a drain electrode 52, and an accumulation gate electrode 54. The electrodes 48, 50, 52, and 54 may be formed of polysilicon or other conductive material suitable for routing electrical signals and voltages. The electrodes may additionally supported by a non-conductive or semiconductive base material. The resonator body 46 is supported off of a base by a distance Z by anchor beams 56. The anchor beams 56 also provide a signal routing path for the voltages which may be applied to or sensed from the electrodes to reach the resonator body 46 via the conductive polysilicon material. As a result, the resonator body 46 has an inversion gate 58, a source contact 60, a drain contact 62, and an accumulation gate 64.

The resonator body 46 has a first dielectric layer 66 which separates the inversion gate 58 from both the source contact 60 and the drain contact 62. The resonator body 46 also has a second dielectric layer 68 which separates the accumulation gate 64 from the source contact 60 and the drain contact 62. The dielectric layers 66, 68 may be formed as an oxide layer or other suitable dielectric material known to those skilled in the art. The first and second dielectric layers 66, 68 in this embodiment are of substantially equal thickness, $t_{ox}$, however other embodiments may utilize first and second dielectric layers with differing thicknesses. The resonator body also has a center region 70 which is coupled between the dielectric layers 66, 68 and separates the source 60 and the drain 62. The center region 70 may be formed of single crystal silicon which may be doped for PMOS (p-type MOS) operation or NMOS (n-type MOS) operation. In this embodiment, the center region 70 is doped for PMOS operation, having an n-type source 70NS, an n-type drain 70ND, and a p-type active region 70P. The source 70NS is coupled to the source contact 60 and the drain 70ND is coupled to the drain contact 62. The active region 70P is in-between the source 70NS and the drain 70ND. In other embodiments, such as for NMOS (n-type MOS) operation, the n-type and p-type regions may be reversed or the p-type region may be undoped.

The inversion gate 58 can act as a drive electrode. The active region 70P near the inversion gate 58 can be biased into accumulation, so that a large capacitive force acts across the first dielectric layer 66, driving resonant motion in the resonator body 46. Because the accumulation charge is a minority carrier in the source 70NS and drain 70ND, its contribution is negligible to the drain current. Subsequent resonant motion in the active region 70P near the gate 58 will modulate the drain current both by physically changing $t_{ox}$ and by piezoresistive modulation of carrier mobility. The internally amplified RBT signal will have significantly lower output impedance than capacitive detection mechanisms, increasing readout precision.

The motional impedance $R_{m,RBT} \equiv I_{Drain}/V_{in}$ of the RBT is given by:

$$R_{m,RBT} = \frac{2L_{CAP}^2 \omega}{\mu_n V_{DC}} R_m \quad (1)$$

where $R_m$ is the motional impedance of a capacitively-transduced resonator of identical geometry, $L_{CAP}$ is the gate length, $\omega$ is the resonant angular frequency, $V_{DC}$ is the gate bias voltage and $\mu_n$ is the effective carrier mobility. In fact, this is a first-order approximation to the improved motional impedance, assuming the modulation of the drain current results only from a physical change in the thickness of the gate oxide 66. Additional current modulation occurs from piezoresistive effects and from strain-induced mobility enhancement in the single-crystal silicon.

Figure 3A:
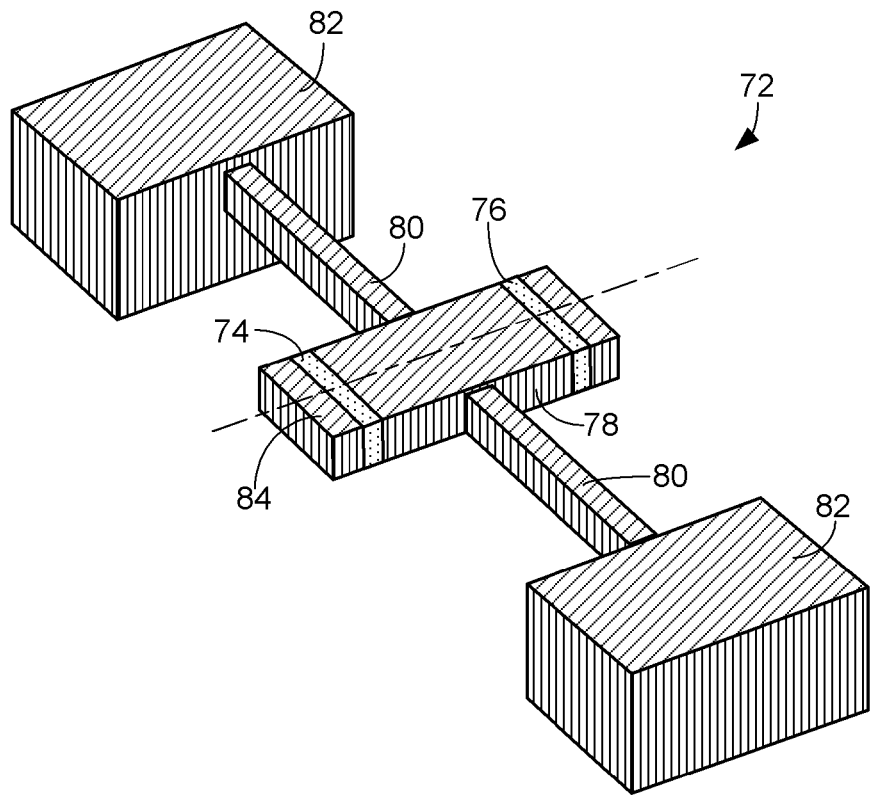
FIG. 3A schematically illustrates an embodiment of a dielectrically transduced free-free longitudinal bulk mode resonator.
Figure 3B:
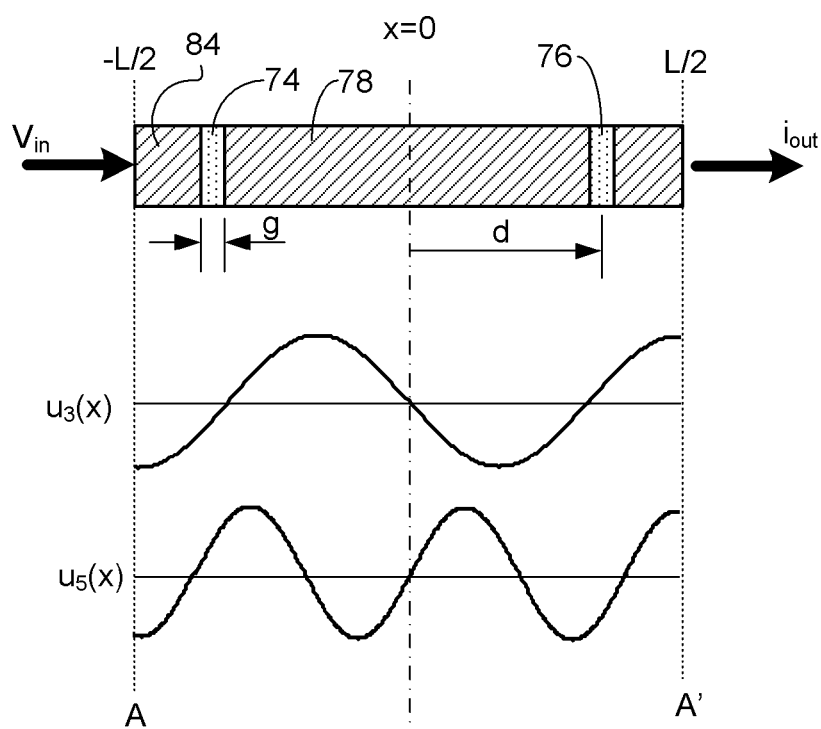
FIG. 3B schematically illustrates a bias voltage being applied to the resonator of FIG. 3A.

It is important to understand the electromechanical principles behind the geometry chosen for the RBT 42. FIG. 3A schematically illustrates an embodiment of a dielectrically transduced free-free longitudinal bulk mode resonator 72. Dielectric films 74, 76 are incorporated into the resonator body 78, driving and sensing electrostatically. The resonator body 78 is suspended and coupled by anchor beams 80 to anchors 82. The resonator body 78 is biased to $V_{DC}$, and a harmonic excitation of amplitude $V_{IN}$ is applied to the drive electrode 84 at resonant frequency. In this example, internal transduction requires that the dielectric films 74, 76 be acoustically matched to the bulk resonator material, thereby maintaining the mode shape and frequency of the resonator 72 without degrading the quality factor. With this assumption, the $n^{th}$ harmonic of the free-free longitudinal mode bar spanning $-L/2 \leq x \leq L/2$ has displacement following $$u(x,t) = U_0 e^{i2\pi f_n t} \sin(k_n x), n \text{ odd}, \quad (2)$$

where $k_n = n\pi/L$ and $U_0$ is the maximum amplitude of vibrations of the bar. FIG. 3B illustrates the $3^{rd}$ harmonic of this longitudinal mode. The resonant frequency of the $n^{th}$ harmonic is $f_n = (n/2L)\sqrt{Y/\rho}$ for Y and $\rho$, the Young's modulus and mass density of the bar, respectively. The driving dielectric film of thickness g is placed at x=d in the resonator. The AC component of the capacitive force across the dielectric of permittivity $\epsilon_f$ is $$f(x, t) = \frac{\epsilon_f A}{g^2} V_{DC} v_{in} e^{i2\pi f_n t} \forall x \in \left[d - \frac{g}{2}, d + \frac{g}{2}\right] \quad (3)$$

Given the equation of motion for damped vibrations in a bar, $$\rho A \frac{\partial^2 u(x,t)}{\partial t^2} - bA \frac{\partial^3 u(x,t)}{\partial t \partial x^2} - YA \frac{\partial^2 u(x,t)}{\partial x^2} = \frac{\partial f(x,t)}{\partial x} \quad (4)$$

and substituting Equation 2 into Equation 4, the amplitude of vibrations at resonant frequency is given by $$U_0 = \frac{2Q\epsilon_f V_{DC} v_{in}}{n^2 \pi^2 Y} \frac{L}{g^2} \left[\sin\left(k_n d - \frac{k_n g}{2}\right) - \sin\left(k_n d + \frac{k_n g}{2}\right)\right] \quad (5)$$

for Q the quality factor of the resonator. This resonance is detected by the changing capacitance due to vibrations at the sensing dielectric film, $$i_{out} = V_{DC} \frac{dC}{dt} = V_{DC} \frac{dC}{du} \frac{du}{dt} = \quad (6)$$

$$\frac{\epsilon_f V_{DC} A}{g^2} \left[\sin\left(k_n d - \frac{k_n g}{2}\right) - \sin\left(k_n d + \frac{k_n g}{2}\right)\right] \cdot 2\pi \cdot f_n U_0 =$$

$$\frac{2Q\epsilon_f^2 V_{DC}^2 A}{n\pi \sqrt{Y\rho} g^4} \left[\sin\left(k_n d - \frac{k_n g}{2}\right) - \sin\left(k_n d + \frac{k_n g}{2}\right)\right] \cdot 2\pi \cdot f_n U_0$$

resulting in a motional impedance $$R_X \equiv \frac{v_{in}}{i_{out}} = \frac{n\pi \sqrt{Y\rho} g^4}{2QA\epsilon_f^2 V_{DC}^2 [\sin(k_n d - k_n g/2) - \sin(k_n d + k_n g/2)]^2} \quad (7)$$

simplifying to $$R_X = \frac{n\pi \sqrt{Y\rho} g^4}{8QA\epsilon_f^2 V_{DC}^2 \cos^2(k_n d) \sin^2(k_n g/2)} \quad (8)$$

Equation 8 provides a great deal of insight into designing an optimal bulk-mode resonator using internal dielectric transduction. As expected, the quartic dependence of the motional impedance on dielectric thickness necessitates the thinnest dielectric possible. This is generally defined by limitations in fabrication and material properties. Furthermore, this form for the motional impedance, differing from air-gap transduction primarily by the trigonometric terms in the denominator, indicates that the position of both drive and sense dielectric films should preferably be substantially centered at a displacement minimum, or strain maximum. Other embodiments may be able to operate with the dielectric films in different locations as determined by the needs of the system. This choice for the position of the dielectric films in this embodiment sets $\cos^2(k_n d)=1$, minimizing $R_X$ with respect to d.

The $\sin^2$ term in the denominator of Equation 8 results from the modal displacement at the dielectric-bulk resonator interface. This factor degrades the performance of the resonator considerably at low frequencies, where the acoustic wavelength $\lambda \gg g$. However, as the resonator scales to higher frequencies, and $\lambda/2 \to g$, the $\sin^2$ term in the denominator approaches unity, reducing motional impedance. Consequently, for a fixed dielectric thickness g determined by fabrication limitations, there is an optimal frequency of operation with acoustic wavelength $\lambda=2g$.

Figure 4:
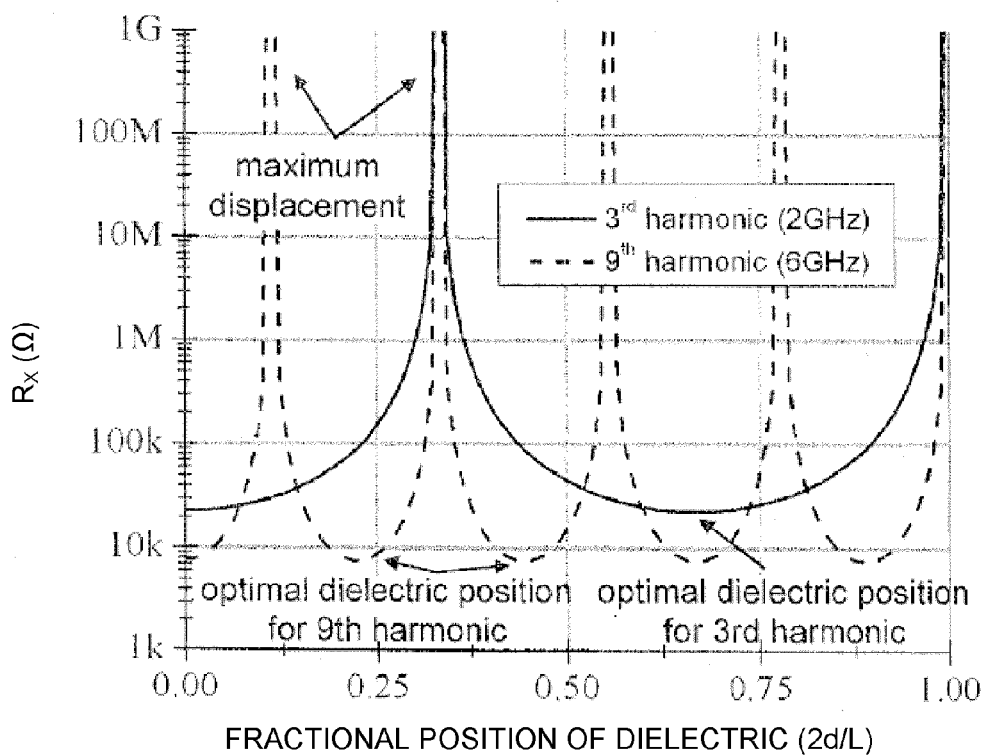
FIG. 4 illustrates one example of the motional impedance $R_X$ of the $3^{rd}$ and $9^{th}$ harmonics of an internally transduced longitudinal bar, varying the dielectric position along the length of the resonator.

FIG. 4 illustrates one example of the motional impedance $R_X$ of the $3^{rd}$ and $9^{th}$ harmonics of an internally transduced longitudinal bar, varying the dielectric position along the length of the resonator. A constant Q of 5000 is used for both $3^{rd}$ and $9^{th}$ harmonics in this example. While in an ideal, isolated resonator made of a defect-free single-crystal material, the quality factor scales as $Q \propto 1/f$, silicon resonators have not yet reached this scaling limit, demonstrating increased f·Q in recent years. Since the Q of these silicon resonators exhibits a strong dependence on many design parameters, it is considered constant in this example for simplicity.

As shown in FIG. 4, minima in the motional impedance occur for points of maximum strain (minimum displacement). The large spatial range near the displacement minima over which $R_X$ is low allows for fabrication of reliable devices despite misalignment tolerances. The coincidence of displacement minima of the $3^{rd}$ and $9^{th}$ harmonics at the fractional dielectric position of $2/3$ allows for the optimal excitation of both modes in the same device. This may be useful for multi-frequency applications. However, if multiple modes are undesired, the $3^{rd}$ harmonic can be suppressed by placing the dielectric at a fractional dielectric position of $2/9$ or $4/9$, near a displacement maximum of the $3^{rd}$ harmonic, while still driving the $9^{th}$ harmonic at maximum strain. Other embodiments could utilize different harmonics, depending on the design of the geometry of the resonator and/or the frequencies being used. For a fixed frequency, the lowest harmonic possible is generally desired. For a fixed resonator dimension, we want higher harmonics to achieve higher frequencies.

Figure 5:
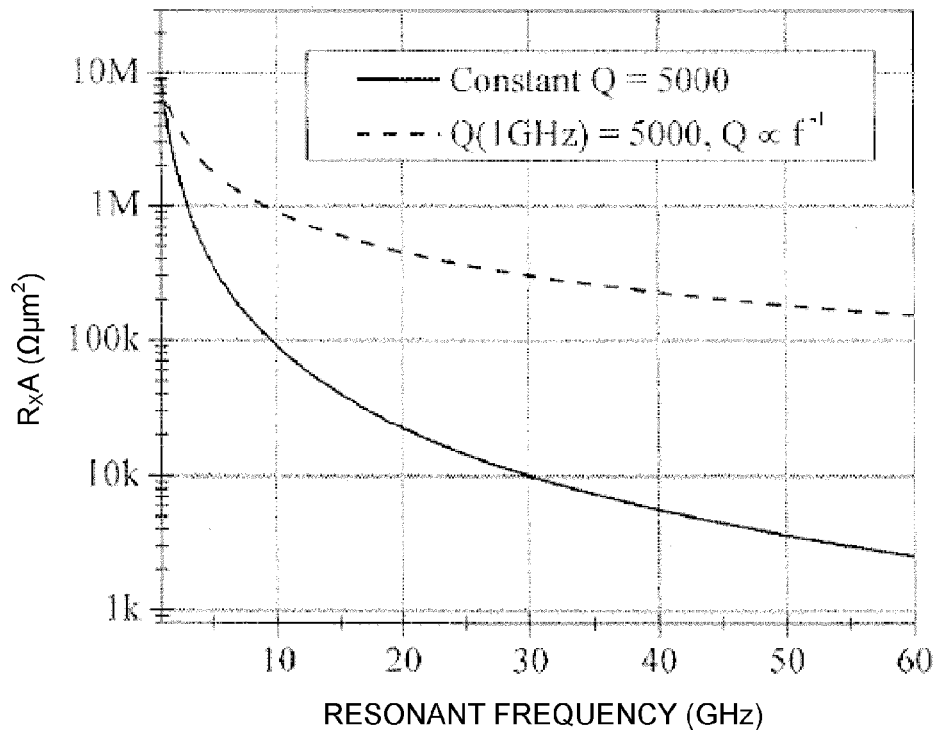
FIG. 5 illustrates an example of frequency scaling of bulk mode longitudinal resonators using internal dielectric transduction.

An example of frequency scaling of bulk mode longitudinal resonators using internal dielectric transduction is illustrated in FIG. 5. The motional impedance $R_X$, normalized to the cross-sectional area of the resonator, decreases drastically with increasing frequency, achieving k$\Omega$ $\mu m^2$ impedances at 60 GHz. Again, a constant Q of 5000 is assumed (solid line in FIG. 5) for simplicity due to the strong dependence of Q on design parameters. The dashed line in FIG. 5 presents frequency scaling of transduction for $Q \propto 1/f$, with a Q of 5000 at 1 GHz. The frequency scaling result of FIG. 5 converges to an FBAR-like resonator or the Bragg reflector for a solid-mounted BAW resonator, stacking multiple dielectrics of thickness $\lambda/2$ between conductive layers of the same thickness. Recently, such devices have been demonstrated successfully in the 10 GHz range.

Common dielectrics such as silicon dioxide ($\kappa \sim 3.9$) and silicon nitride ($\kappa \sim 7$) perform reliably in films as thin as a few nanometers. For such transduction film thickness, the motional impedance is minimized at >50 GHz, but may be too high for 1-10 GHz operation. Low impedance resonators in the radio and microwave frequency range can be achieved by using high-$\kappa$ dielectric materials, such as Barium Strontium Titanate (BST). While BST films are not electrically reliable below $\sim$200 nm, they exhibit a high permittivity often exceeding 300. Generally speaking any material with a higher $\kappa$ than nitride would be a high permittivity material, for example, hafnium dioxide ($\kappa=28$). This type of high-permittivity dielectric may offer a great advantage in obtaining low-impedance internally transduced resonators at low-GHz frequencies. Some embodiments may only care about higher GHz frequencies and may therefore be able to use lower permittivity dielectrics. In some embodiments, it may be desirable to have dielectrics with strong electrostrictive properties. It is also useful for some embodiments to choose a dielectric which is closely matched acoustically to the resonator body material.

As one example, minimizing Equation 8 with respect to resonant frequency for a 200 nm dielectric film, one obtains an optimal frequency of operation at 10.7 GHz. Assuming a Q of 5000 and a bias voltage of 20 V, this structure has 10 k$\Omega$ $\mu m^2$ impedance at $3^{rd}$ harmonic resonance. For instance, a 50$\Omega$ BST resonator at 10 GHz can be obtained by stacking the bulk/dielectric layers vertically (thickness extensional mode) with a 10 $\mu m \times 20$ $\mu m$ footprint, or by forming a 2 $\mu m$ thick extensional ring [8] with an approximate radius of 16 um.

Embodiments of longitudinal bar resonators were designed and fabricated in silicon to demonstrate the feasibility of the theory above. The highest acoustic frequency believed to be measured in silicon resonators as of the date of the parent application filing was recorded at 4.51 GHz. One purpose of the experiment was to verify the optimal design for 'internal dielectric transduction' of longitudinal bulk mode MEMS resonators. This transduction mechanism increases in efficiency as the dielectric thickness approaches the acoustic half-wave length in silicon. With dielectric films at positions of maximum strain (minimum displacement) in the resonator, a 4.51 GHz resonator was demonstrated with a 9.8 dB signal enhancement relative to its performance at 1.53 GHz. Our analysis and experimental verification of improved resonator performance at higher frequency may enable scaling of MEMS resonators to previously unattainable frequencies.

Optimization of Dielectric Transduction: A longitudinal-mode bar resonator was driven and sensed electrostatically with thin vertical dielectric layers, such as was illustrated in the embodiment of FIG. 3. The resonator body was biased to $V_{DC}$, and a harmonic excitation of amplitude $V_{in}$ was applied to the drive electrode at resonant frequency. The 2-port motional impedance $R_X \equiv V_{in}/i_{out}$ for the $n^{th}$ harmonic of the resonator is given by Equation 8:

$$R_X = \frac{n\pi\sqrt{Y\rho}\,g4}{8QA\varepsilon_f^2 V_{DC}^2 \cos^2(k_n d)\sin^2(k_n g/2)}$$

where Y and $\rho$ are the Young's modulus and mass density of the resonator, respectively. Here, $\in_f$ is the dielectric permittivity, g is the dielectric thickness, d is the position of the dielectric along the bar, A is the transduction area, and $k_n = n\pi/L$ is the resonance wave number. As discussed previously, FIG. 4 presents the analytical motional impedance $R_X$ of the $3^{rd}$ and $9^{th}$ harmonics of an internally transduced longitudinal bar, varying the dielectric position along the length of the resonator. As shown in FIG. 4, minima in the motional impedance occur for points of maximum strain (minimum displacement). The large spatial range near the displacement minima over which $R_X$ is low allows for fabrication of reliable devices despite misalignment tolerances during fabrication.

The quartic dependence of $R_X$ on the dielectric thickness g indicates that to minimize $R_X$, the thinnest possible dielectric film should be used. The increased frequency of vibration in higher harmonics (and thus the increased wave number $k_n$) means that as the acoustic half-wavelength approaches g, the $\sin^2$ term in the denominator of the equation above approaches unity, reducing $R_X$. This effect outweighs the linear dependence of the motional impedance on the order of the harmonic, resulting in an overall reduction in $R_X$ for higher harmonics.

The position of the dielectric can be exploited to design resonators which preferentially excite higher harmonics. For example, if the dielectric film is placed at a displacement node of the $9^{th}$ harmonic near the center of the resonator, then the motional impedance of lower harmonics will be too high to excite vibrations, and spurious modes will be minimized. In this study, the dielectric is placed at the coincidence of displacement nodes for both $3^{rd}$ and $9^{th}$ harmonics, optimizing transduction for both modes.

Figure 6A:
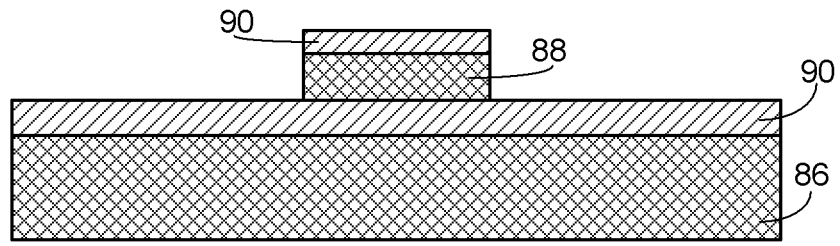
FIGS. 6A-6G illustrate fabrication steps in one embodiment of a fabrication process used to produce one embodiment of a resonating body transistor.
Figure 6B:
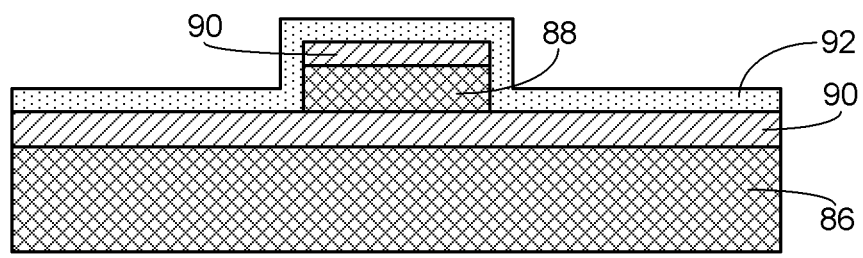
Figure 6C:
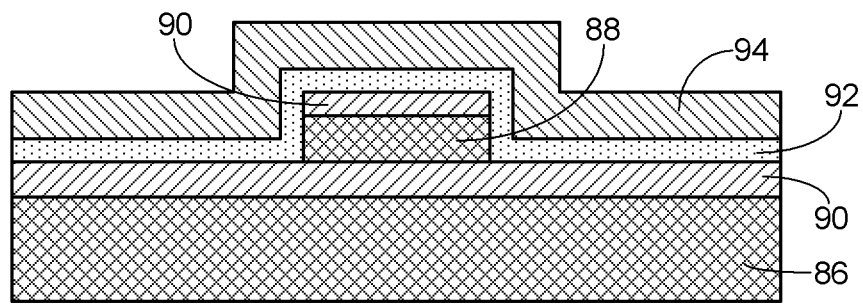
Figure 6D:
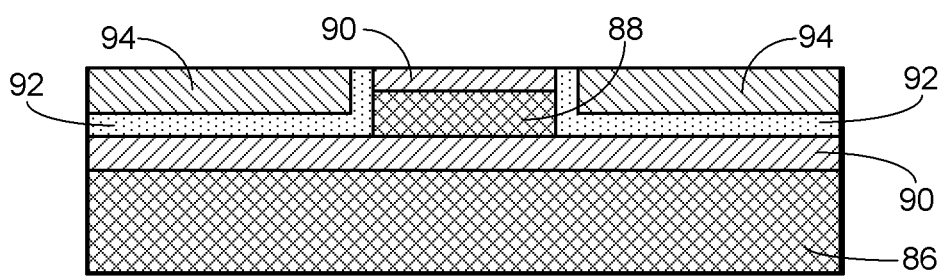
Figure 6E:
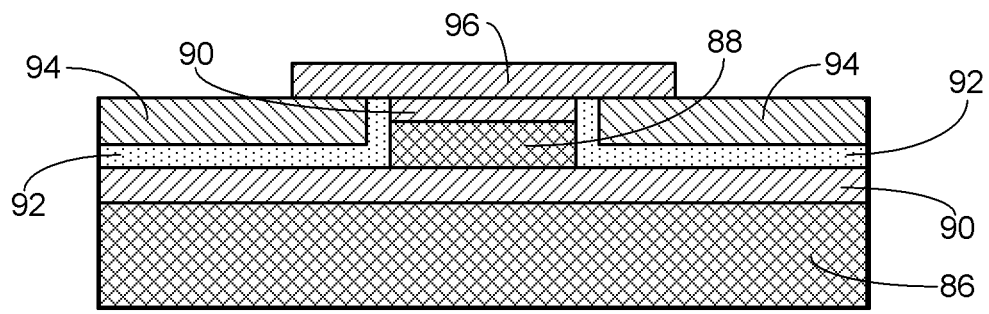
Figure 6F:
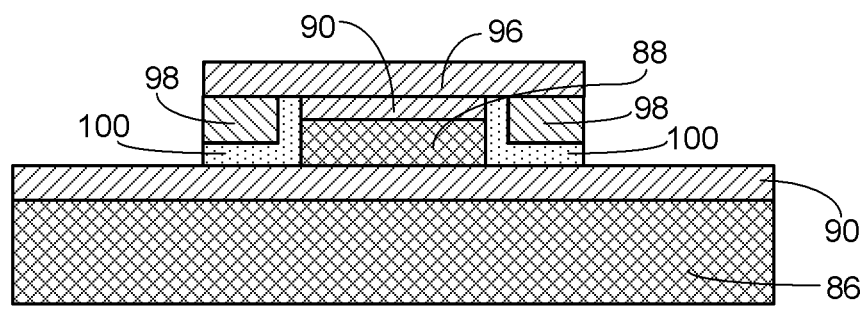
Figure 6G:
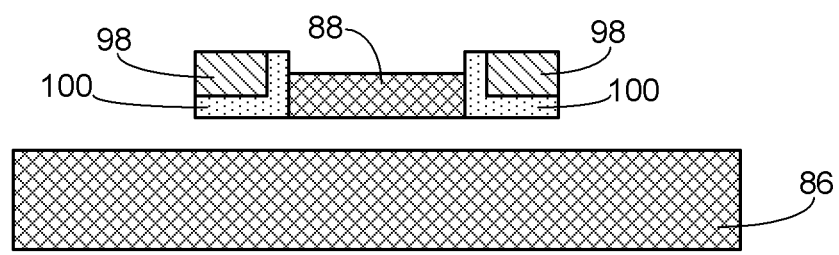
Figure 7A:
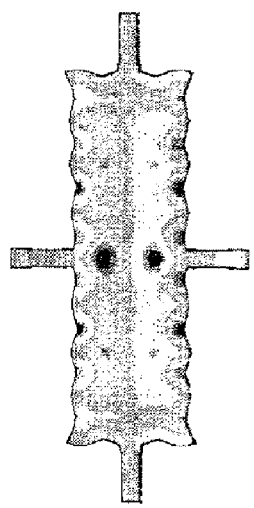
FIG. 7A illustrates the mode shape of the of an experimental RBT embodiment.
Figure 7B:
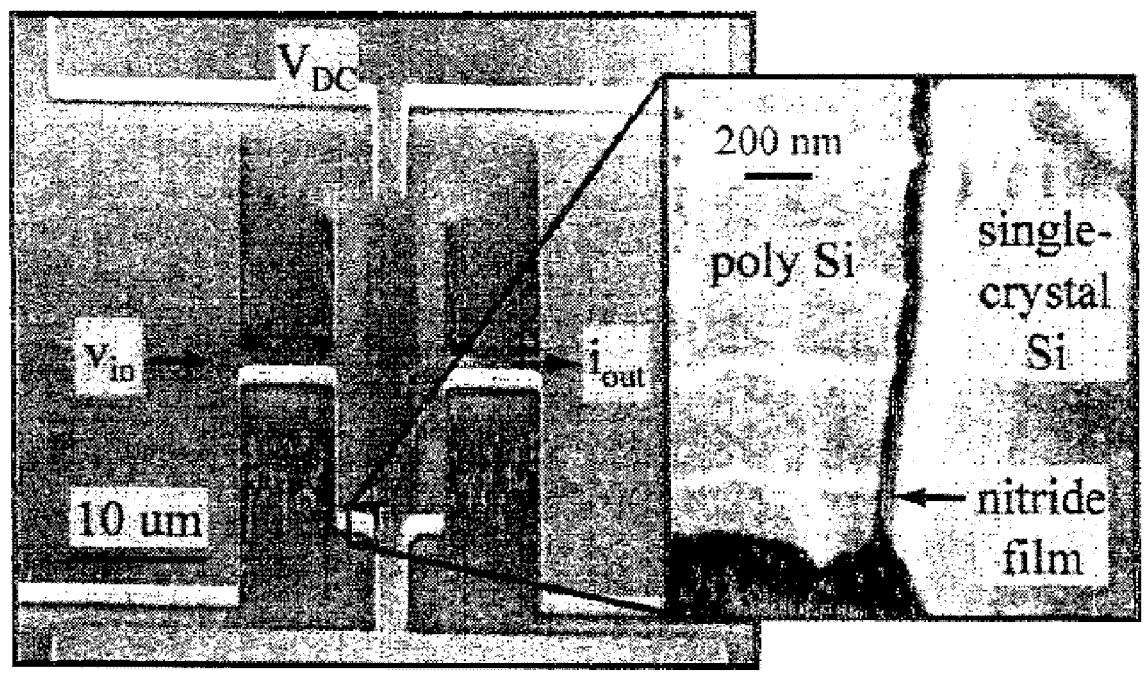
FIG. 7B illustrates a picture from a scanning electron microscope (SEM) of the experimental RBT embodiment modeled in FIG. 7A.

FIGS. 6A-6G illustrate fabrication steps in one embodiment of a fabrication process used to produce one embodiment of a resonating body transistor which was used in the experimental verification. As FIG. 6A illustrates, a base 86 is etched, for example, by using a deep reactive ion etching (DRIE) process to define one or more device structures 88. The base 86 and subsequent device structures 88 may be formed of silicon or other suitable semiconductive or dopable material. The base 86 and device layer 88 are then oxidized to form a sacrificial oxide mask 90. As FIG. 6B illustrates, a dielectric layer 92 is deposited on the oxide mask 90. In the experiment which was run, a 15 nm silicon nitride dielectric layer 92 was formed, although other dielectric materials and/or thicknesses could be used in other embodiments. As FIG. 6C illustrates, a conductive polysilicon layer 94 is deposited. The polysilicon layer 94 forms the electrode traces which can receive bias voltages to apply to the resonant body transistor which will be formed. As FIG. 6D illustrates, the top side of the composite structure is polished, for example by chemical-mechanical planarization (CMP). The polishing removes some of the polysilicon layer 94 and the dielectric layer 92 until the device layer 88 or the sacrificial mask 90 over the device layer 88 is exposed. As FIG. 6E illustrates, a patterned sacrificial oxide mask 96 is deposited at least over areas of the polysilicon 94 which are to be protected from subsequent steps. As FIG. 6F illustrates, the exposed polysilicon areas are removed along with subsequently exposed dielectric areas, for example by DRIE to leave a patterned polysilicon 98 and a patterned dielectric layer 100. Doping may also occur after etching of the polysilicon layer and before removal of the hard oxide mass on top of the polysilicon. The hard oxide mask acts as a self-aligned doping mask for the active region of the transistor, while allowing the source and drain to be doped. As FIG. 6G then illustrates, the sacrificial oxide layers 90 are removed, for example by a hydrofluoric (HF) release process. A Critical Point Drying process (CPD) may also be performed. CPD brings the fluid in which the released resonators are submerged (generally isopropyl alcohol or methanol) to its critical point (by changing temperature and pressure) so that the liquid evaporates without forming a meniscus on the resonator in order to avoid causing pull-in and stiction In the experiment which was run, the resonators were fabricated in a combined SOI-polysilicon process using a 15 nm silicon nitride film for transduction. Suspension beams for the resonators were designed at quarter-wave length to minimize anchor losses for both $3^{rd}$ and $9^{th}$ harmonics and to dampen spurious modes. FIG. 7A illustrates the mode shape of the of the experimental resonator embodiment. The non-ideal routing beams distort the longitudinal mode shape. Nonetheless, the longitudinal deformation along the dielectric film is preserved. FIG. 7B illustrates a scanning electron micrograph (SEM) of a dielectrically transduced silicon bar resonator (8.5 μm long×40 μm wide×2.5 μm tall). The inset image shows the thin nitride gap between the polysilicon and single crystal regions of the resonator. Though the outer rim of nitride is removed in the HF release step, the nitride remains in the majority of the transduction area as evidenced by capacitive measurements.

Figure 8:
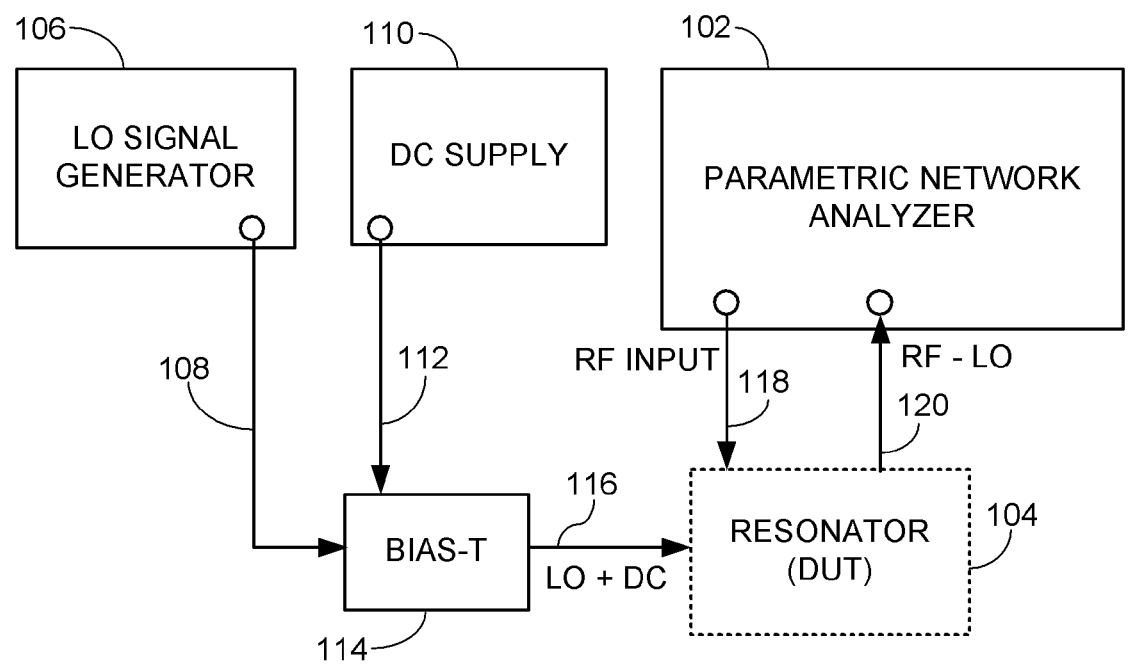
FIG. 8 schematically illustrates one embodiment of a testing setup for evaluating the embodied RBT discussed above.
Figure 9A:
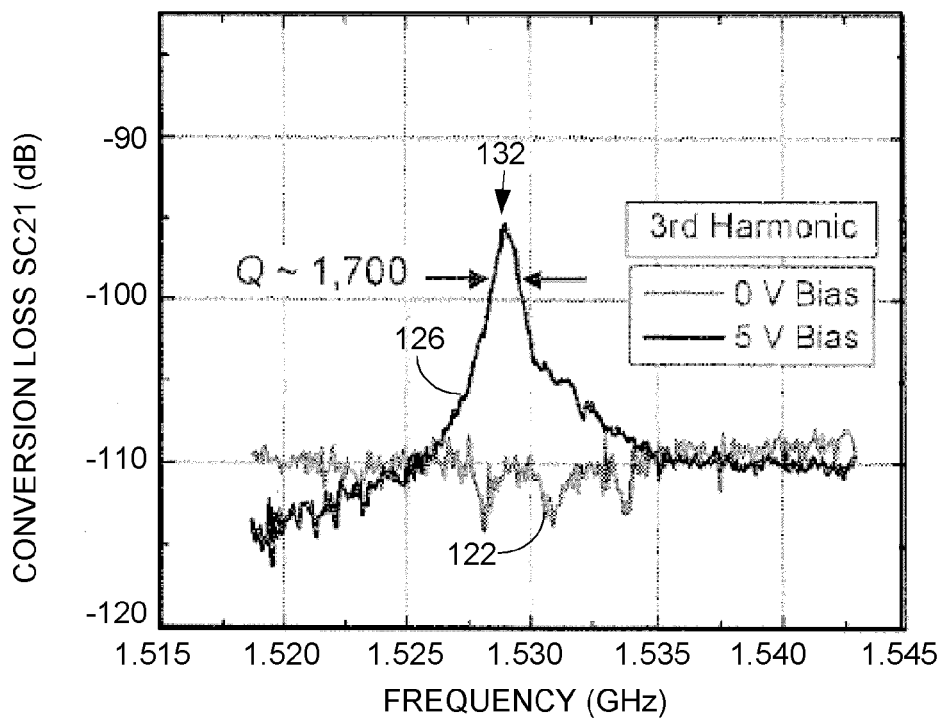
FIGS. 9A and 9B illustrate an experimental resonator's frequency response at the $3^{rd}$ and $9^{th}$ harmonics respectively.
Figure 9B:
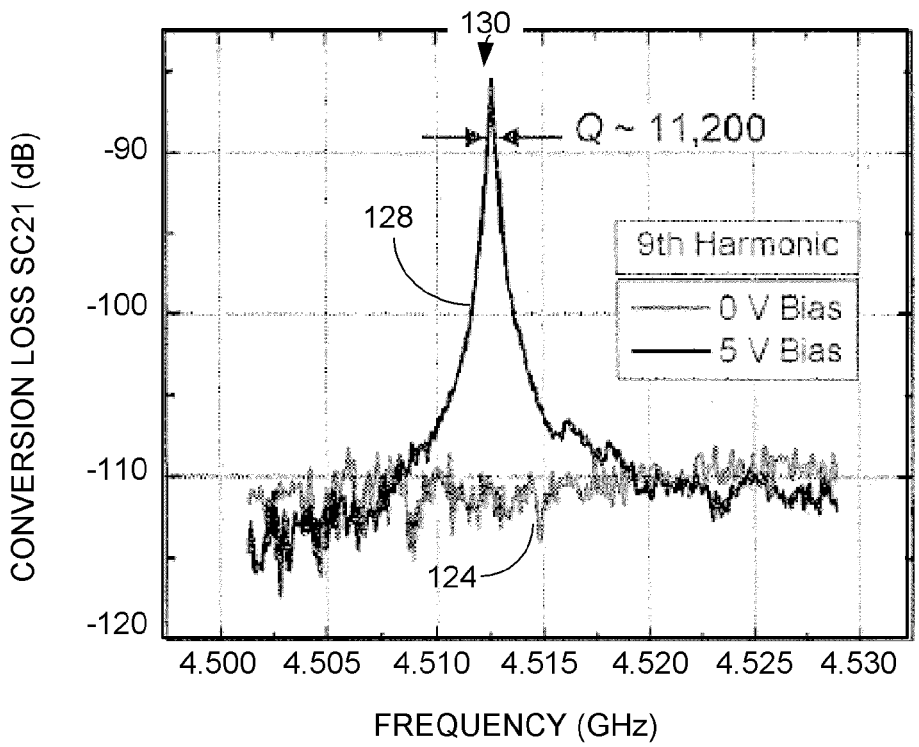

FIG. 8 schematically illustrates one embodiment of a testing setup for evaluating the embodied capacitive transduction discussed above. A scalar mixing measurement using an Agilent® Parametric Network Analyzer (PNA) 102 was performed to obtain the frequency response of the resonator 104 under test. A scalar mixer calibration technique traditionally used to characterize RF mixers was implemented to measure the performance of the high frequency resonators (which also behave as passive MEMS mixers). A local oscillator (LO) signal generator 106 provides an LO frequency signal 108, and a DC Supply 110 provides a DC bias voltage 112. The DC bias voltage 112 is combined with the LO frequency signal at a bias-T 114 (current injector). The combined DC bias voltage and LO frequency signal 116 are coupled to the center of the resonator 104 body. The RF Input 118 is applied to the driving gate of the resonator 104 and the RF-LO signal 120 is picked off from the resonator 104 sensing gate and fed back to the PNA 102. This method cancels losses and parasitic transmission-line resonances in routing and probe-pads of the 3-port MEMS device and provides an accurate measurement of mechanical Q at frequencies well above 1 GHz. Resonators were tested in a Lakeshore vacuum probe station, applying a 5V bias, −10 dBm LO, and 0 dBm RF input. FIGS. 9A and 9B illustrate the experimental resonator's frequency response at the $3^{rd}$ and $9^{th}$ harmonics respectively. The LO leakage of the device (grey traces 122 and 124) was obtained by setting the bias voltage to 0V. Acoustic resonance was excited when a 5V bias was applied (black traces 126 and 128). The $9^{th}$ harmonic 130, with a Q of 11,200, shows a 9.8 dB signal improvement over the $3^{rd}$ harmonic 132, with a Q of only 1,700.

The motional impedance in Equation 2 is inversely proportional to Q. To extract the relationship of transducer efficiency with frequency scaling, we normalize the scalar conversion loss at resonance by the Q of the harmonic. Taking this into account, the 4.51 GHz normalized signal improves by 2 dB relative to the 1.53 GHz normalized response. The analytical model predicts an ~3× improvement in motional impedance between the $3^{rd}$ and $9^{th}$ harmonics, translating to a 4.7 dB signal improvement. The discrepancy may be due to small misalignment (<200 nm) and the effects of the width-distortion of the longitudinal mode-shape (previously illustrated in FIG. 7A).

Experiment Conclusion: A 4.51 GHz longitudinal bar resonator was demonstrated, marking the highest frequency measured to date in silicon. The $3^{rd}$ and $9^{th}$ harmonics of longitudinal vibration were excited in a silicon bar resonator, demonstrating a 9.8 dB absolute improvement in signal strength and 2 dB (Q-normalized) enhancement in transduction, efficiency for the $9^{th}$ harmonic (4.51 GHz) relative to the $3^{rd}$ harmonic (1.53 GHz). These results indicate improved resonator performance with increased frequency, providing a design to scale MEMS resonators to previously unattainable frequencies in silicon.

The Longitudinal Mode Internal Dielectric RBT

The lowest order realistic longitudinal mode for RBT transduction is n=2, with a displacement node at the center for routing the transistor source and drain. A quantitative comparison between capacitive and RBT transduction of the $2^{nd}$ harmonic longitudinal mode resonator is presented in FIGS. 10A and 10B, assuming constant carrier mobility and a constant quality factor Q of 1000 for simplicity. An AC input voltage $v_{in}$=0.1V is superimposed on a bias voltage $V_{DC}$=10V. The resonator's width (equivalent to the gate length) is only ⅓ of the resonator length due to ebeam lithography resolution limitations at high frequency (L=71 nm at 60 GHz). This required ratio can potentially cause significant short-channel effects, but could be compensated-for by an optional small hole approximately in the center of the resonator to divert current flow and therefore, effectively block undesired body current. The resonator height is held constant at 200 nm, limited by DRIE aspect ratio limitations.

Figure 10A:
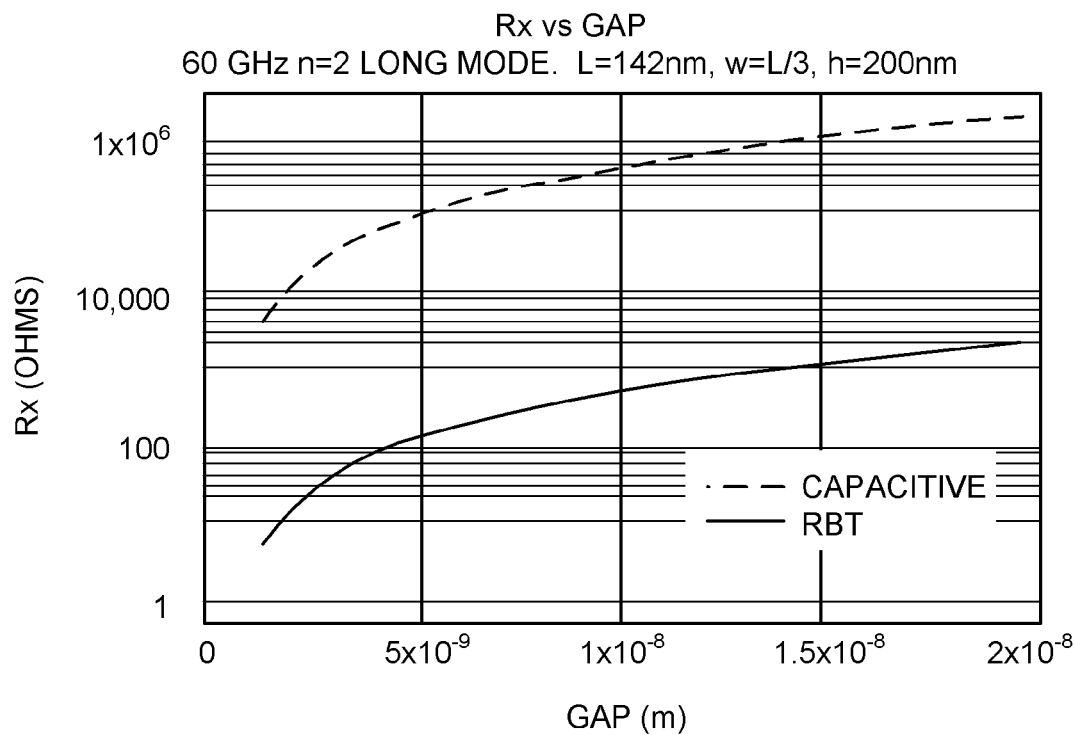
FIG. 10A illustrates motional impedance as a function of dielectric gap for both a dielectric capacitive transduction device and an RBT transduction device.
Figure 10B:
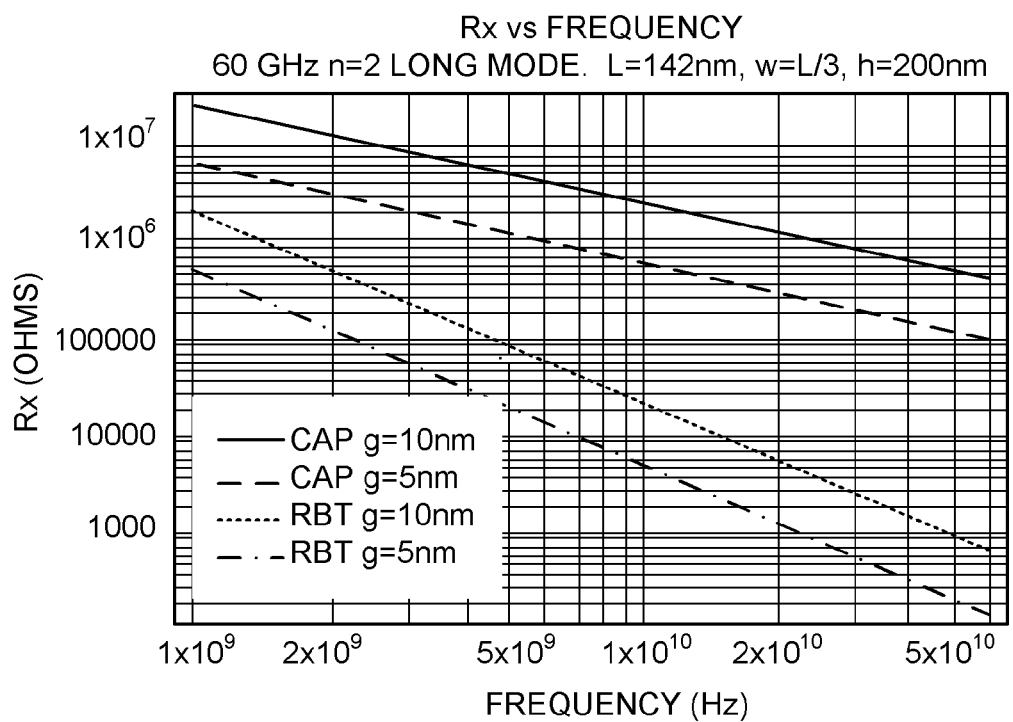
FIG. 10B illustrates motional impedance as a function of frequency for both a dielectric capacitive transduction device and an RBT transduction device.

FIG. 10A illustrates motional impedance, RX, as a function of dielectric gap for both a dielectric capacitive transduction device and an RBT transduction device. Similarly, FIG. 10B illustrates motional impedance, RX, as a function of frequency for both a dielectric capacitive transduction device and an RBT transduction device. FIGS. 10A and 10B demonstrate the importance of internal signal amplification in detecting high frequency mechanical resonance in nanoscale structures. The capacitive resonator exhibits motional impedance on the order of 1 MΩ, barring its integration into macroscopic systems. On the other hand, the RBT can achieve ~100Ω motional impedance at 60 GHz, and scales to even lower impedance at 200-500 GHz.

Operation of the Resonant Body Transistor (RBT)

Figure 11:
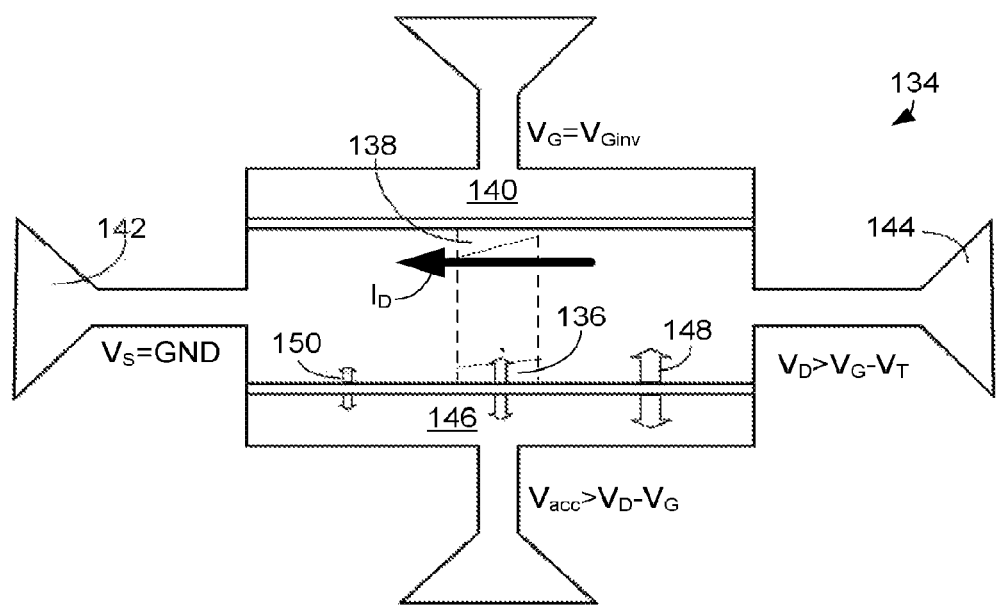
FIG. 11 schematically illustrates an embodiment of a resonant body transistor (RBT) for purposes of describing the operation of the RBT.

FIG. 11 schematically illustrates an embodiment of a resonant body transistor (RBT) 134 for purposes of describing the operation of the RBT. As discussed in embodiments above, the RBT 134 is geometrically similar to the longitudinal-mode internal dielectrically transduced resonator, apart from the doping in the center of the resonator which allows for an accumulation layer 136 and an inversion layer 138 in the resonator body. The RBT is biased as shown in FIG. 11. An inversion gate voltage $V_{G_{inv}}$ (limited by the breakdown voltage of the dielectric) is applied to one gate 140, generating an inversion layer 138. The source 142 is tied to ground, while the drain 144 is biased to $V_D > V_{G_{inv}} - V_T$ to drive the transistor in saturation. The DC saturation drain current $I_D$ is given by $$I_D = \frac{1}{2}\mu_n \frac{\varepsilon_f}{g}\frac{h}{L_{gate}}(V_G - V_T)^2. \quad (9)$$

An accumulation voltage $V_{acc}$ with an AC excitation voltage $v_{ac}$ is applied at the accumulation gate 146, driving resonance. $V_{acc}$ is limited by the breakdown voltage across the dielectric, so that $V_{acc} > V_D - V_G$. For a breakdown voltage of 3V, $V_G$=3V, $V_D$>2.4V=2.5V, $V_{acc}$=−0.5V so that the drop from accumulation gate to drain is 3V. The electrostatic force for actuation is distributed across three regions. The force 148 is strongest between the accumulation gate and the drain region due to the large voltage drop across the dielectric. The force 150 is weakest between the accumulation gate and the source. The amplitude of vibrations of longitudinal resonance is $$U_0|_{RBT} = U_0|_{Cap}\left[\frac{1}{V_{DC}W}\left[\left(\frac{W}{2} - \frac{L_{gate}}{2}\right)(V_D - V_{acc}) - \right.\right. \quad (10)$$
$$\left.\left.\left(\frac{W}{2} - \frac{L_{gate}}{2}\right)\cdot V_{acc} + \frac{L_{gate}}{2}(V_D - V_{acc})\right]\right]$$

where $U_0|_{Cap}$ is given in Equation 5. The strain induced in the resonator piezoresistively modulates the drain current $I_D$ running through the inversion layer 138. Assuming a piezoresistive coefficient of $\pi_{110}$ for current traveling perpendicular to the normal of elastic wave fronts along 110, the change in mobility is given by $$\frac{d\mu_n}{\mu_n} = \pi_{110}Y\frac{\partial u}{\partial x}\bigg|_{inversion} \quad (11)$$
$$= \pi_{110}Yk_n U_0|_{RBT}\cos\left(\frac{k_n g}{2}\right).$$

The piezoresistive mobility modulation of Equation 11 generates an AC current linearly dependent on the drain current:

$$i_{out}|_{RBT} = I_D\left(\frac{d\mu_n}{\mu_n} + \frac{2U_0|_{RBT}\sin\left(\frac{k_n g}{2}\right)}{g}\right) \approx I_D\frac{d\mu_n}{\mu_n} \quad (12)$$

Figure 12:
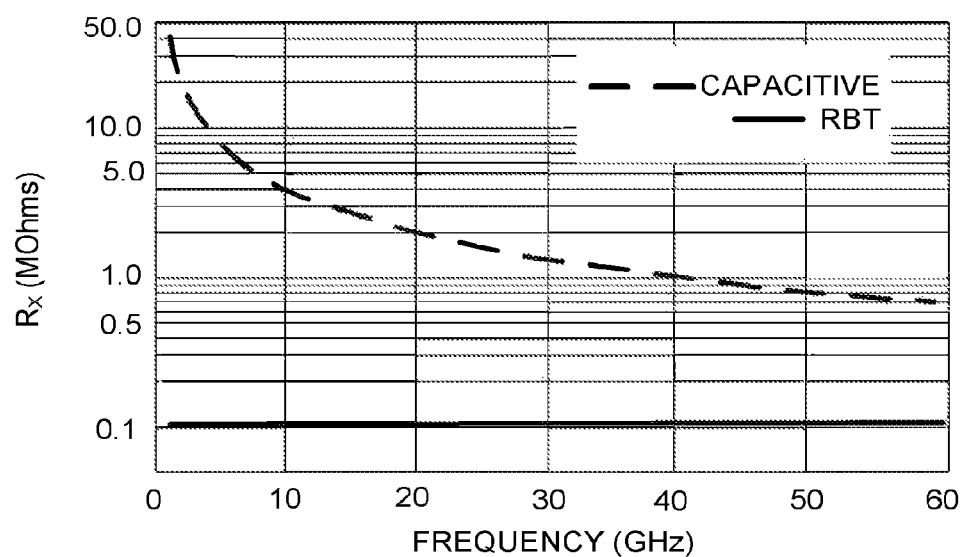
FIG. 12 illustrates motional impedance, $R_X$, as a function of frequency for both a dielectric capacitive transduction device and an RBT transduction device.

The second term in Equation 12 is attributed to change in the gate capacitance as the bar expands and contracts. However, its contribution to current modulation is more than an order of magnitude smaller than that of piezoresistance. The resulting motional impedance is $$R_{x,RBT} = \frac{2n\pi w L_{gate} g^3 \csc\left(\frac{k_n g}{2}\right)}{Qh\pi_{110}\mu_n \varepsilon_f^2 (V_G - V_T)^2 (w(2V_G - V_D) - L_{gate}(V_G - V_D))} \quad (13)$$

which is even more predictive than the model proposed in Equation 1, since it takes into effect a contribution to the output signal from a piezoresistive effect. FIG. 12 illustrates motional impedance, $R_X$, as a function of frequency for both a dielectric capacitive transduction device and an RBT transduction device based on the model of Equation 13.

Resonant Body Oscillator

Figure 13:
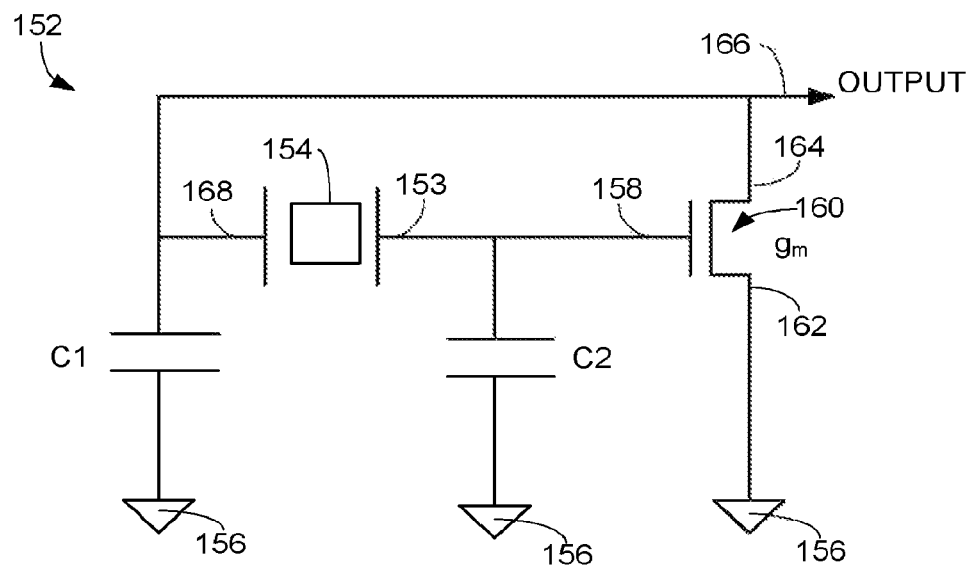
FIG. 13 illustrates one embodiment of a Pierce crystal oscillator.

FIG. 13 illustrates one embodiment of a Pierce crystal oscillator 152. A shunt capacitor C2 is coupled between the output 153 of a crystal 154 and a ground 156. The output 153 of the crystal 154 is also coupled to the gate 158 of an FET transistor 160. The source 162 of the transistor 160 is coupled to ground 156. The drain 164 of the transistor 160 is coupled to an oscillator output 166. The oscillator output 166 is also fed-back and coupled to an input 168 of the crystal 154. A feedback capacitor C1 is coupled between the oscillator output 166 and ground 156 in order to control the feedback. Capacitor C2 helps to adjust the resonant frequency of the crystal 154. The Capacitors each produce a 180 degree phase shift while the transistor 160 provides the gain necessary to close the feedback loop. The transistor 160 has a nearly infinite input impedance and a nearly zero output impedance. Therefore, the transistor tries to force the input 158 and the output 166 to be identical. With the 180 degree phase shift between input and output, however, the output voltage ends up oscillating.

Figure 14:
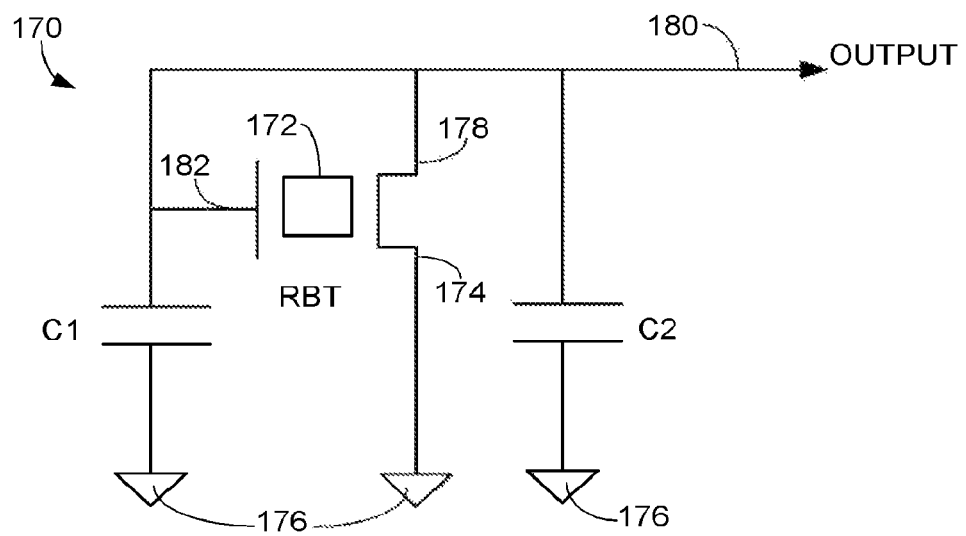
FIG. 14 schematically illustrates one embodiment of a resonant body oscillator.

FIG. 14 schematically illustrates one embodiment of a resonant body oscillator 170. The heart of the resonant body oscillator is a resonant body transistor (RBT) 172. A source 174 of the RBT 172 is coupled to a ground 176. A drain 178 of the RBT 172 is coupled to an oscillator output 180. The oscillator output 180 is also fed-back and coupled to an accumulation gate 182 of the RBT 172. A feedback capacitor C1 is coupled between the oscillator output 180 and ground 176 in order to control the feedback. In this embodiment, a capacitor C2 is also shunted from the output 180 and ground 176 and in combination with C1, helps to produce a phase shift which will resonate with the phase shift produced by the RBT 172 in order to cause the output voltage to oscillate. Since C1 and C2 are in parallel between the oscillator output 180 and ground 176, they could be replaced in other embodiments by a single capacitor equal to the sum of both C1 and C2. Not illustrated in this embodiment is the inversion gate of the RBT 172. The inversion gate will need to be connected to a suitable bias voltage in order for the resonant body oscillator to be active, since the bias voltage applied to the inversion gate will enable a drain current to flow.

The resonant body oscillator has many benefits. The crystal and transistor necessary for an oscillator like the Pierce oscillator can be replaced by a single RBT, which can be engineered to incorporate the one or more needed shunt capacitors. Therefore, the entire oscillator can be formed from a single Resonant Body Transistor, as shown in FIG. 14, with a footprint of <1 $\mu m^2$. The new symbol in FIG. 14 representing the resonant body oscillator 172 indicates the integration of the crystal and transistor into a single component. The low phase noise of the oscillator, due to the high Q and high resonant frequency of the RBT, will produce a high sensitivity, low power resonant body oscillator (RBO).

The advantages of a resonant body transistor and oscillator have been discussed herein. Embodiments discussed have been described by way of example in this specification. It will be apparent to those skilled in the art that the foregoing detailed disclosure is intended to be presented by way of example only, and is not limiting. The RBT embodiments discussed above have a longitudinal extensional bar resonator. However, the RBT may be formed with many bulk acoustic resonant modes. These include, but are not limited to, the thickness shear mode, width extensional mode, and thickness extensional mode. Furthermore, the embodied RBT presented is rectangular, but other embodiments can take on many various shapes to accommodate different resonant modes or to optimize transistor geometry and routing.

The RBT embodiments discussed above employ two gates in a split-gate configuration. One gate is used to bias the region into accumulation to drive acoustic resonance. The other gate is held at constant voltage biasing the region into strong inversion. In other embodiments, however, the entire channel region could instead be biased into strong inversion with a DC+AC voltage on both gates. In this configuration, the AC force could still drive acoustic resonance, and the same principle could hold as in the case of the split gate embodiments. Consequently, the gates need not be driven independently.

The RBT embodiments discussed above are released from the supporting substrate and suspended by support beams (which also function as routing beams). This is done to minimize acoustic losses into the substrate. However, in other embodiments, the device may be used unreleased, or fully surrounded by a cladding material. While some losses may occur due to the changed physical boundary conditions of the RBT, it may still function in this mode.

Various other alterations, improvements, and modifications will occur and are intended to those skilled in the art, though not expressly stated herein. These alterations, improvements, and modifications are intended to be suggested hereby, and are within the spirit and the scope of the claimed invention. Additionally, the recited order of processing elements or sequences, or the use of numbers, letters, or other designations therefore, is not intended to limit the claims to any order, except as may be specified in the claims. Accordingly, the invention is limited only by the following claims and equivalents thereto.

What is claimed is:

1. A resonator body, comprising:
   an inversion gate;
   an accumulation gate;
   a center region;
   a source contact coupled to the center region;
   a drain contact coupled to the center region;
   a first dielectric layer coupled between the inversion gate and the center region; and
   a second dielectric layer coupled between the accumulation gate and the center region;
   wherein at least one of a length of the resonator body, a width of the resonator body, a height of the resonator body and a gate length define an acoustically resonant mode and resonant frequency.

2. The resonator body of claim 1, wherein the center region comprises:
   an active region coupled to the inversion gate and the accumulation gate;
   a source coupled to the source contact; and
   a drain coupled to the drain contact.

3. The resonator body of claim 2, wherein the active region comprises a p-type dopant.

4. The resonator body of claim 2, wherein the active region comprises an n-type dopant.

5. The resonator body of claim 2, wherein the source and drain comprise a p-type dopant.

6. The resonator body of claim 2, wherein the source and drain comprise an n-type dopant.

7. The resonator body of claim 2, wherein the inversion gate extends at least as long as a length of the active region.

8. The resonator body of claim 2, wherein the accumulation gate extends at least as long as a length of the active region.

9. The resonator body of claim 1, wherein the first dielectric layer is selected from the group consisting of an oxide, silicon dioxide, silicon nitride, Barium Strontium Titanate, and hafnium dioxide.

10. The resonator body of claim 1, wherein the second dielectric layer is selected from the group consisting of an oxide, silicon dioxide, silicon nitride, Barium Strontium Titanate, and hafnium dioxide.

11. The resonator body of claim 1, wherein the first and second dielectric layers are substantially the same thickness.

12. The resonator body of claim 1, further comprising at least one feedback capacitor coupled to the source.

13. The resonator body of claim 1, wherein the resonator body comprises a resonator mode selected from the group consisting of a longitudinal extension bar mode, a thickness shear mode, a width extension mode, and a thickness extension mode.

14. The resonator body of claim 1, wherein the resonator body comprises a shape selected from the group consisting of a rectangle, a square, an oval, a circle, and a hexagon.

15. The resonator body of claim 1, wherein the first dielectric layer and the second dielectric layer are substantially centered at a strain maximum.

16. A resonant body transistor, comprising:
an inversion gate electrode;
an accumulation gate electrode;
a source electrode;
a drain electrode;
a plurality of anchor beams; and
a resonator body coupled-to and suspended from the inversion gate electrode, the accumulation gate electrode, the source electrode, and the drain electrode by the plurality of anchor beams;
wherein at least one of a length of the resonator body, a width of the resonator body, a height of the resonator body and a gate length define an acoustically resonant mode and resonant frequency.

17. The resonant body transistor of claim 16, wherein the resonator body comprises:
in an inversion gate coupled to the inversion gate electrode;
an accumulation gate coupled to the accumulation gate electrode;
a center region;
a source contact coupled to the center region and to the source electrode;
a drain contact coupled to the center region and to the drain electrode;
a first dielectric layer coupled between the inversion gate and the center region; and
a second dielectric layer coupled between the accumulation gate and the center region.

18. The resonant body transistor of claim 17, wherein the center region comprises:
an active region coupled to the inversion gate and the accumulation gate;
a source coupled to the source contact; and
a drain coupled to the drain contact.

19. The resonant body transistor of claim 18, wherein the active region comprises a p-type dopant.

20. The resonant body transistor of claim 18, wherein the active region comprises an n-type dopant.

21. The resonant body transistor of claim 18, wherein the source and drain comprise a p-type dopant.

22. The resonant body transistor of claim 18, wherein the source and drain comprise an n-type dopant.

23. The resonant body transistor of claim 18, wherein the inversion gate extends at least as long as a length of the active region.

24. The resonant body transistor of claim 18, wherein the accumulation gate extends at least as long as a length of the active region.

25. The resonant body transistor of claim 17, wherein the first dielectric layer is selected from the group consisting of an oxide, silicon dioxide, silicon nitride, Barium Strontium Titanate, and hafnium dioxide.

26. The resonant body transistor of claim 17, wherein the second dielectric layer is selected from the group consisting of an oxide, silicon dioxide, silicon nitride, Barium Strontium Titanate, and hafnium dioxide.

27. The resonant body transistor of claim 17, wherein the first and second dielectric layers are substantially the same thickness.

28. The resonant body transistor of claim 17, further comprising at least one feedback capacitor coupled to the source.

29. The resonant body transistor of claim 17, wherein the inversion gate and the accumulation gate are the same device.

30. The resonator body transistor of claim 17, wherein the first dielectric layer and the second dielectric layer are substantially centered at a strain maximum.

31. The resonant body transistor of claim 16, wherein the resonator body comprises a resonator mode selected from the group consisting of a longitudinal extension bar mode, a thickness shear mode, a width extension mode, and a thickness extension mode.

32. The resonant body transistor of claim 16, wherein the resonator body comprises a shape selected from the group consisting of a rectangle, a square, an oval, a circle, and a hexagon.

33. The resonant body transistor of claim 16, wherein the inversion gate electrode is coupled to the accumulation gate electrode.

34. A resonant body oscillator, comprising:
a) a resonant body transistor, comprising:
1) an inversion gate electrode;
2) an accumulation gate electrode;
3) a source electrode;
4) a drain electrode;
5) a plurality of anchor beams; and
6) a resonator body coupled-to and suspended from the inversion gate electrode, the accumulation gate electrode, the source electrode, and the drain electrode by the plurality of anchor beams; and
b) at least one capacitor coupled to the accumulation gate electrode on one end of the at least one capacitor and configured to receive a ground connection on a second end of the at least one capacitor; and
c) wherein:
1) the inversion gate electrode is configured to receive a bias voltage;
2) the source electrode is configured receive a ground connection; and
3) the drain electrode is coupled to the accumulation gate electrode and configured to provide an oscillator output.

35. A method of fabricating an resonant body transistor, comprising:
etching a base to define a resonant device layer, the device layer comprising a semiconductor material;
forming a sacrificial mask on the etched base and the device layer;
depositing a dielectric layer on the sacrificial mask;
depositing a conductive layer on the dielectric layer;
planarizing the formed layers to expose either the device layer or the sacrificial mask on the device layer;
depositing a patterned sacrificial mask at least over some portions of the conductive layer;
removing exposed areas of the conductive layer and the dielectric layer; and
removing the sacrificial mask and the patterned sacrificial mask, wherein the device layer is in contact with the patterned dielectric layer and the patterned dielectric layer is in contact with the patterned conductive layer.

36. The method of claim 35, wherein the etching comprises etching the base to define a center region of the resonant body transistor.

37. The method of claim 35, wherein etching a base to define a device layer comprises a deep reactive ion etching (DRIE) process.

38. The method of claim 35, wherein forming a sacrificial mask on the etched base and the device layer comprises forming an oxide.

39. The method of claim 35, wherein depositing a dielectric layer on the sacrificial mask comprises depositing a material selected from the group consisting of an oxide, silicon dioxide, silicon nitride, Barium Strontium Titanate, and hafnium dioxide.

40. The method of claim 35, wherein depositing a conductive layer on the dielectric layer comprises depositing a polysilicon layer.

41. The method of claim 35, wherein removing exposed areas of the conductive layer and the dielectric layer comprise using a DRIE process.

42. The method of claim 35, wherein removing the sacrificial mask and the patterned sacrificial mask comprise a hydrofluoric (HF) release process.

* * * * *